United States Patent
Kaushansky et al.

(10) Patent No.: US 9,759,772 B2
(45) Date of Patent: *Sep. 12, 2017

(54) PROGRAMMABLE TEST INSTRUMENT

(75) Inventors: David Kaushansky, Belmont, MA (US); Lloyd K. Frick, Pepperell, MA (US); Stephen J. Bourassa, Tewksbury, MA (US); David Vandervalk, Chelmsford, MA (US); Michael Thomas Fluet, Litchfield, NH (US); Michael Francis McGoldrick, North Reading, MA (US)

(73) Assignee: Teradyne, Inc., North Reading, MA (US)

( * ) Notice: Subject to any disclaimer, the term of this patent is extended or adjusted under 35 U.S.C. 154(b) by 815 days.

This patent is subject to a terminal disclaimer.

(21) Appl. No.: 13/284,483

(22) Filed: Oct. 28, 2011

(65) Prior Publication Data

US 2013/0110445 A1    May 2, 2013

(51) Int. Cl.
*G01L 15/00* (2006.01)
*G01R 31/319* (2006.01)

(52) U.S. Cl.
CPC . *G01R 31/31908* (2013.01); *G01R 31/31926* (2013.01)

(58) Field of Classification Search
CPC .............. G06F 19/00; G01R 31/31908; G01R 31/31926; G01R 31/31907
USPC ........................................................ 702/121
See application file for complete search history.

(56) References Cited

U.S. PATENT DOCUMENTS

| 588,385 A | 8/1897 | Black |
| 604,448 A | 5/1898 | Wells |
| 3,789,360 A | 1/1974 | Clark, Jr. et al. |
| 3,800,090 A | 3/1974 | Matena |
| 3,810,120 A | 5/1974 | Huettner et al. |

(Continued)

FOREIGN PATENT DOCUMENTS

| JP | H04-122141 A | 4/1992 |
| JP | 2004-199536 A | 7/2004 |

(Continued)

OTHER PUBLICATIONS

International search report and written opinion mailed Mar. 18, 3013 in international application No. PCT/US2012/056247, 10 pgs.

(Continued)

*Primary Examiner* — Toan Le
*Assistant Examiner* — XiuQuin Sun
(74) *Attorney, Agent, or Firm* — Choate, Hall & Stewart LLP; Paul Pysher

(57) ABSTRACT

In general, a test instrument includes a first processing system that is programmable to run one or more test programs to test a device interfaced to the test instrument, and that is programmed to control operation of the test instrument, a second processing system that is dedicated to device testing, the second processing system being programmable to run one or more test programs to test the device, and programmable logic configured to act as an interface between the test instrument and the device, the programmable logic being configurable to perform one or more tests on the device. The first processing system and the second processing system are programmable to access the device via the programmable logic.

19 Claims, 4 Drawing Sheets

(56) References Cited

U.S. PATENT DOCUMENTS

| | | |
|---|---|---|
| 3,833,888 A | 9/1974 | Stafford et al. |
| 3,864,670 A | 2/1975 | Inoue et al. |
| 3,873,818 A | 3/1975 | Barnard |
| 4,038,533 A | 7/1977 | Dummermuth et al. |
| 4,042,972 A | 8/1977 | Gruner et al. |
| 4,195,351 A | 3/1980 | Barner et al. |
| 4,357,703 A | 11/1982 | Van Brunt |
| 4,466,055 A | 8/1984 | Kinoshita et al. |
| 4,481,625 A | 11/1984 | Roberts et al. |
| 4,496,985 A | 1/1985 | Jensen et al. |
| 4,509,008 A | 4/1985 | DasGupta et al. |
| 4,511,968 A | 4/1985 | Fencsik et al. |
| 4,525,802 A | 6/1985 | Hackamack |
| RE32,326 E | 1/1987 | Nagel et al. |
| 4,658,209 A | 4/1987 | Page |
| 4,775,976 A | 10/1988 | Yokoyama |
| 4,807,147 A | 2/1989 | Halbert et al. |
| 4,823,363 A | 4/1989 | Yoshida |
| 4,890,102 A | 12/1989 | Oliver |
| 4,901,259 A | 2/1990 | Watkins |
| 4,961,053 A | 10/1990 | Krug |
| 5,049,814 A | 9/1991 | Walker, III et al. |
| 5,061,033 A | 10/1991 | Richard |
| 5,072,175 A | 12/1991 | Marek |
| 5,091,692 A | 2/1992 | Ohno et al. |
| 5,177,630 A | 1/1993 | Goutzoulis et al. |
| 5,218,684 A | 6/1993 | Hayes et al. |
| 5,282,166 A | 1/1994 | Ozaki |
| 5,289,116 A | 2/1994 | Kurita et al. |
| 5,295,079 A | 3/1994 | Wong et al. |
| 5,339,279 A | 8/1994 | Toms et al. |
| 5,345,109 A | 9/1994 | Mehta |
| 5,404,480 A | 4/1995 | Suzuki |
| 5,410,547 A | 4/1995 | Drain |
| 5,444,716 A | 8/1995 | Jarwala et al. |
| 5,471,524 A | 11/1995 | Colvin et al. |
| 5,475,624 A | 12/1995 | West |
| 5,477,160 A | 12/1995 | Love |
| 5,490,282 A | 2/1996 | Dreps et al. |
| 5,493,519 A | 2/1996 | Allen, III |
| 5,524,114 A | 6/1996 | Peng |
| 5,528,136 A | 6/1996 | Rogoff et al. |
| 5,543,707 A | 8/1996 | Yoneyama et al. |
| 5,550,480 A | 8/1996 | Nelson et al. |
| 5,566,296 A | 10/1996 | Ohmori et al. |
| 5,581,742 A | 12/1996 | Lin et al. |
| 5,583,874 A | 12/1996 | Smith et al. |
| 5,583,893 A | 12/1996 | Nguyen |
| 5,598,156 A | 1/1997 | Hush et al. |
| 5,604,888 A | 2/1997 | Kiani-Shabestari et al. |
| 5,606,567 A | 2/1997 | Agrawal et al. |
| 5,614,838 A | 3/1997 | Jaber et al. |
| 5,633,899 A | 5/1997 | Fiedler et al. |
| 5,636,163 A | 6/1997 | Furutani et al. |
| 5,673,276 A | 9/1997 | Jarwala et al. |
| 5,675,813 A | 10/1997 | Holmdahl |
| 5,740,086 A | 4/1998 | Komoto |
| 5,778,004 A | 7/1998 | Jennion et al. |
| 5,781,718 A | 7/1998 | Nguyen |
| 5,784,581 A | 7/1998 | Hannah |
| 5,807,767 A | 9/1998 | Stroupe |
| 5,844,856 A | 12/1998 | Taylor |
| 5,845,151 A | 12/1998 | Story et al. |
| 5,859,993 A | 1/1999 | Snyder |
| 5,867,436 A | 2/1999 | Furutani et al. |
| 5,875,132 A | 2/1999 | Ozaki |
| 5,875,198 A | 2/1999 | Satoh |
| 5,883,852 A | 3/1999 | Ghia et al. |
| 5,887,050 A | 3/1999 | Fenske et al. |
| 5,889,936 A | 3/1999 | Chan |
| 5,896,534 A | 4/1999 | Pearce et al. |
| 5,920,483 A | 7/1999 | Greenwood et al. |
| 5,929,651 A | 7/1999 | Leas et al. |
| 5,930,168 A | 7/1999 | Roohparvar |
| 5,937,154 A | 8/1999 | Tegethoff |
| 5,942,911 A | 8/1999 | Motika et al. |
| 5,946,472 A | 8/1999 | Graves et al. |
| 5,951,704 A | 9/1999 | Sauer et al. |
| 5,959,887 A | 9/1999 | Takashina et al. |
| 5,959,911 A | 9/1999 | Krause et al. |
| 5,969,986 A | 10/1999 | Wong et al. |
| 5,990,815 A | 11/1999 | Linder et al. |
| 5,996,102 A | 11/1999 | Haulin |
| 6,002,868 A | 12/1999 | Jenkins et al. |
| 6,023,428 A | 2/2000 | Tran |
| 6,028,439 A | 2/2000 | Arkin et al. |
| 6,044,481 A | 3/2000 | Kornachuk et al. |
| 6,049,896 A | 4/2000 | Frank et al. |
| 6,064,213 A | 5/2000 | Khandros et al. |
| 6,069,494 A | 5/2000 | Ishikawa |
| 6,073,193 A | 6/2000 | Yap |
| 6,074,904 A | 6/2000 | Spikes, Jr. et al. |
| 6,075,373 A | 6/2000 | Iino |
| 6,084,215 A | 7/2000 | Furuya et al. |
| 6,128,242 A | 10/2000 | Banba et al. |
| 6,146,970 A | 11/2000 | Witek et al. |
| 6,148,354 A | 11/2000 | Ban et al. |
| 6,154,803 A | 11/2000 | Pontius et al. |
| 6,157,975 A | 12/2000 | Brief et al. |
| 6,189,109 B1 | 2/2001 | Sheikh et al. |
| 6,202,103 B1 | 3/2001 | Vonbank et al. |
| 6,208,947 B1 | 3/2001 | Beffa |
| 6,232,904 B1 | 5/2001 | Hartmann et al. |
| 6,272,112 B1 | 8/2001 | Orita |
| 6,304,982 B1 | 10/2001 | Mongan et al. |
| 6,320,811 B1 | 11/2001 | Snyder et al. |
| 6,320,866 B2 | 11/2001 | Wolf et al. |
| 6,324,663 B1 | 11/2001 | Chambers |
| 6,330,241 B1 | 12/2001 | Fort |
| 6,343,260 B1 | 1/2002 | Chew |
| 6,345,373 B1 | 2/2002 | Chakradhar et al. |
| 6,351,134 B2 | 2/2002 | Leas et al. |
| 6,360,271 B1 | 3/2002 | Schuster et al. |
| 6,363,085 B1 | 3/2002 | Samuels |
| 6,363,506 B1 * | 3/2002 | Karri ............... G01R 31/31837 714/733 |
| 6,370,635 B2 | 4/2002 | Snyder |
| 6,380,753 B1 | 4/2002 | Iino et al. |
| 6,393,588 B1 | 5/2002 | Hsu et al. |
| 6,400,173 B1 | 6/2002 | Shimizu et al. |
| 6,404,218 B1 | 6/2002 | Le et al. |
| 6,452,411 B1 | 9/2002 | Miller et al. |
| 6,483,330 B1 | 11/2002 | Kline |
| 6,509,213 B2 | 1/2003 | Noble |
| 6,515,484 B1 | 2/2003 | Bald et al. |
| 6,526,557 B1 | 2/2003 | Young et al. |
| 6,527,563 B2 | 3/2003 | Clayton |
| 6,531,335 B1 | 3/2003 | Grigg |
| 6,535,831 B1 | 3/2003 | Hudson et al. |
| 6,549,155 B1 | 4/2003 | Heminger et al. |
| 6,551,844 B1 | 4/2003 | Eldridge et al. |
| 6,559,666 B2 | 5/2003 | Bernier et al. |
| 6,563,173 B2 | 5/2003 | Bolam et al. |
| 6,571,357 B1 | 5/2003 | Martin et al. |
| 6,603,323 B1 | 8/2003 | Miller et al. |
| 6,627,484 B1 | 9/2003 | Ang |
| 6,627,954 B1 | 9/2003 | Seefeldt |
| 6,703,852 B1 | 3/2004 | Feltner |
| 6,704,888 B1 | 3/2004 | Caudrelier et al. |
| 6,724,848 B1 | 4/2004 | Iyer |
| 6,727,723 B2 | 4/2004 | Shimizu et al. |
| 6,734,693 B2 | 5/2004 | Nakayama |
| 6,735,720 B1 | 5/2004 | Dunn et al. |
| 6,753,238 B2 | 6/2004 | Kurita |
| 6,759,865 B1 | 7/2004 | Gu et al. |
| 6,774,395 B1 | 8/2004 | Lin et al. |
| 6,798,225 B2 | 9/2004 | Miller |
| 6,825,052 B2 | 11/2004 | Eldridge et al. |
| 6,825,683 B1 | 11/2004 | Berndt et al. |
| 6,847,218 B1 | 1/2005 | Nulty et al. |
| 6,849,928 B2 | 2/2005 | Cha et al. |
| 6,856,150 B2 | 2/2005 | Sporck et al. |
| 6,876,214 B2 | 4/2005 | Crook et al. |
| 6,903,562 B1 | 6/2005 | Smith et al. |

(56) References Cited

U.S. PATENT DOCUMENTS

| | | | |
|---|---|---|---|
| 6,912,778 B2 | 7/2005 | Ahn et al. | |
| 6,917,998 B1 | 7/2005 | Giles | |
| 6,959,257 B1 | 10/2005 | Larky et al. | |
| 6,975,130 B2 | 12/2005 | Yevmenenko | |
| 6,978,335 B2 | 12/2005 | Lee | |
| 7,036,062 B2 | 4/2006 | Morris et al. | |
| 7,102,367 B2 | 9/2006 | Yamagishi et al. | |
| 7,112,975 B1 | 9/2006 | Jin et al. | |
| 7,113,902 B2 | 9/2006 | Swoboda | |
| 7,127,708 B2 | 10/2006 | Gomez | |
| 7,138,811 B1 | 11/2006 | Mahoney et al. | |
| 7,154,259 B2 | 12/2006 | Miller | |
| 7,218,134 B1 | 5/2007 | Ho | |
| 7,245,134 B2 | 7/2007 | Granicher et al. | |
| 7,307,433 B2 | 12/2007 | Miller et al. | |
| 7,327,153 B2 | 2/2008 | Weinraub | |
| 7,381,630 B2 | 6/2008 | Sawyer | |
| 7,536,679 B1 | 5/2009 | O'Connell et al. | |
| 7,595,746 B2 | 9/2009 | Iorga et al. | |
| 7,733,096 B2 | 6/2010 | Lin et al. | |
| 7,906,982 B1 | 3/2011 | Meade et al. | |
| 7,949,916 B1 | 5/2011 | Ang | |
| 8,103,992 B1 | 1/2012 | Chan et al. | |
| 8,239,590 B1 | 8/2012 | Wennekamp et al. | |
| 8,798,741 B2* | 8/2014 | Ryan et al. | 607/5 |
| 9,470,759 B2* | 10/2016 | Bourassa | G01R 31/31926 |
| 2002/0105352 A1 | 8/2002 | Mori et al. | |
| 2002/0145437 A1 | 10/2002 | Sporck et al. | |
| 2002/0171449 A1 | 11/2002 | Shimizu et al. | |
| 2003/0074611 A1 | 4/2003 | Nachumovsky | |
| 2003/0084388 A1 | 5/2003 | Williamson et al. | |
| 2003/0115517 A1 | 6/2003 | Rutten | |
| 2003/0206535 A1 | 11/2003 | Shpak | |
| 2003/0210031 A1 | 11/2003 | Miller | |
| 2003/0210069 A1 | 11/2003 | Kikuchi et al. | |
| 2003/0233208 A1 | 12/2003 | Uesaka et al. | |
| 2004/0008024 A1 | 1/2004 | Miller | |
| 2004/0036493 A1 | 2/2004 | Miller | |
| 2004/0075453 A1 | 4/2004 | Slupsky | |
| 2004/0175850 A1 | 9/2004 | Shimizu et al. | |
| 2004/0181763 A1 | 9/2004 | Soltis et al. | |
| 2005/0047339 A1 | 3/2005 | Dube et al. | |
| 2005/0093571 A1 | 5/2005 | Suaris et al. | |
| 2005/0110513 A1 | 5/2005 | Osada et al. | |
| 2005/0129033 A1 | 6/2005 | Gordy et al. | |
| 2005/0171722 A1 | 8/2005 | Fritzsche | |
| 2005/0182588 A1 | 8/2005 | Chenoweth et al. | |
| 2005/0193266 A1 | 9/2005 | Subramanian et al. | |
| 2005/0204223 A1 | 9/2005 | Ong | |
| 2005/0237073 A1* | 10/2005 | Miller et al. | 324/754 |
| 2005/0262412 A1 | 11/2005 | Mukai et al. | |
| 2006/0028897 A1 | 2/2006 | Vernenker et al. | |
| 2006/0100812 A1 | 5/2006 | Sturges et al. | |
| 2006/0156288 A1 | 7/2006 | Jones et al. | |
| 2006/0242504 A1 | 10/2006 | Kadota | |
| 2006/0273809 A1* | 12/2006 | Miller et al. | 324/754 |
| 2007/0074191 A1 | 3/2007 | Geisinger | |
| 2007/0162729 A1 | 7/2007 | Ryu et al. | |
| 2007/0176807 A1 | 8/2007 | Mattes et al. | |
| 2007/0245289 A1 | 10/2007 | Suaris et al. | |
| 2007/0261009 A1 | 11/2007 | Granicher et al. | |
| 2007/0277154 A1 | 11/2007 | Badwe | |
| 2008/0040641 A1 | 2/2008 | Blancha et al. | |
| 2008/0250288 A1* | 10/2008 | Souef et al. | 714/731 |
| 2008/0274629 A1 | 11/2008 | Meyer | |
| 2008/0278190 A1 | 11/2008 | Ong et al. | |
| 2008/0297167 A1 | 12/2008 | Possa | |
| 2009/0024381 A1 | 1/2009 | Sakamoto et al. | |
| 2009/0066365 A1 | 3/2009 | Solomon | |
| 2009/0091347 A1 | 4/2009 | Gohel et al. | |
| 2009/0101940 A1 | 4/2009 | Barrows et al. | |
| 2009/0112548 A1* | 4/2009 | Conner | 703/13 |
| 2009/0113245 A1* | 4/2009 | Conner | 714/33 |
| 2009/0119084 A1 | 5/2009 | Nagashima et al. | |
| 2009/0119542 A1 | 5/2009 | Nagashima et al. | |
| 2009/0128162 A1 | 5/2009 | Singleton et al. | |
| 2009/0138567 A1 | 5/2009 | Hoover et al. | |
| 2009/0167583 A1* | 7/2009 | Iorga et al. | 341/145 |
| 2009/0217311 A1 | 8/2009 | Kocyan et al. | |
| 2009/0299677 A1 | 12/2009 | Torres | |
| 2010/0058274 A1 | 3/2010 | Pike et al. | |
| 2010/0146338 A1 | 6/2010 | Schalick et al. | |
| 2010/0164527 A1 | 7/2010 | Weyh et al. | |
| 2010/0174955 A1 | 7/2010 | Carnevale et al. | |
| 2010/0180169 A1 | 7/2010 | La Fever et al. | |
| 2010/0287424 A1 | 11/2010 | Kwon | |
| 2010/0313071 A1* | 12/2010 | Conner | 714/33 |
| 2011/0067040 A1 | 3/2011 | Nagahara et al. | |
| 2011/0291693 A1 | 12/2011 | Ong et al. | |
| 2012/0198279 A1 | 8/2012 | Schroeder | |
| 2013/0031276 A1 | 1/2013 | Rathi et al. | |
| 2013/0070640 A1 | 3/2013 | Chapman | |
| 2013/0110446 A1 | 5/2013 | Bourassa et al. | |
| 2013/0111505 A1 | 5/2013 | Frick et al. | |

FOREIGN PATENT DOCUMENTS

| | | |
|---|---|---|
| JP | 2009-031933 | 2/2009 |
| JP | 2009-116878 A | 5/2009 |
| JP | 2011-502265 A | 1/2011 |
| KR | 10-2009-0107579 | 2/2009 |
| KR | 10-2009-0028569 | 3/2009 |
| KR | 10-2009-0107579 | 10/2009 |
| WO | WO-97/36230 A1 | 10/1997 |
| WO | 2010/054669 | 5/2010 |

OTHER PUBLICATIONS

International Preliminary Report on Patentability mailed Mar. 18, 3013 in international application no. PCT/US2012/056247, 6 pgs.
Full Machine Translation, KR10-2009-0028569, 45 pgs.
J.L. Anderson Jr., "Test application program interface for instrumentation", In: Autotestcon, IEEE, Sep. 21, 2006, pp. 272-276, See abstract; p. 273, paragraph 3: and figure 1.
Authorized officer Sung Cheal Byun, International Search Report and Written Opinion mailed Jan. 30, 2013 in international application No. PCT/US2012/056250, 9 pgs.
Search Report dated Feb. 24, 2015 in European application No. 12843264.8, 6 pgs.
Search Report dated Feb. 24, 2015 in European application No. 12843399.2, 7 pgs.
Search Report dated Jan. 29, 2015 in European application No. 12842878.6, 8 pgs.
Majid et al., "Stretching the limits of FPGA SerDes for enhanced ATE performance", School of Electrical and Computer Engineering Georgia Institute of Technology, Atlanta, GA, USA (2010), 6 pgs.
International Search Report dated Mar. 18, 2013 in International Application No. PCT/US2012/056245, 9 pgs.
International Preliminary Report on Patentability mailed May 8, 2014 in International Application No. PCT/US2012/056245, 6 pgs.
International Preliminary Report on Patentability mailed Apr. 29, 2014 in International Application No. PCT/US2012/056250, 6 pgs.
Full Machine Translation of KR10-2009-0107579, 14 pgs.
Full Machine Translation of JP2009-031933, 24 pgs.
Bengtsson, S. and Engstrom, O., Interface Charge Control of Directly Bonded Silicon Structures, Journal of Applied Physics, 66: 1231-1239 (1989).
Catalyst Enterprises Inc., TA700/800 Series PCI-X, PCI, CPCI, PMC BUS Analyzer-Exerciser User's Manual, 268 pages (2005).
EPO Communication pursuant to Article 94(3) EPC for EP12842878.6, 6 pages (Sep. 16, 2015).
File History of U.S. Appl. No. 10/828,755 (now U.S. Pat. No. 7,307,433), 230 pages (Retrieved Mar. 16, 2017).
File History of U.S. Appl. No. 11/711,382 (now U.S. Pat. No. 7,906,982), 497 pages (Retrieved Mar. 16, 2017).
File History of U.S. Appl. No. 11/964,254 (now U.S. Pat. No. 7,595,746), 148 pages (Retrieved Mar. 16, 2017).
File History of U.S. Appl. No. 13/284,378 (now U.S. Pat. No. 9,470,479), 404 pages (Retrieved Mar. 16, 2017).

(56) References Cited

OTHER PUBLICATIONS

File History of U.S. Appl. No. 13/284,491, 543 pages (Retrieved Mar. 16, 2017).
Free Online Dictionary of Computing, "DB-25", 2 pages (Dec. 8, 1996). URL: http://foldoc.org/DB-25 [Retrieved Mar. 20, 2017].
Free Online Dictionary of Computing, "emulation", 2 pages (May 22, 2003). URL: http://foldoc.org/emulation [Retrieved Mar. 20, 2017].
Free Online Dictionary of Computing, "host", 2 pages (Feb. 16, 1995). URL: http://foldoc.org/host [Retrieved Mar. 20, 2017].
International Search Report for PCT/US19970/04032, 3 pages (Jul. 11, 1997).
International Search Report for PCT/US2003/014844, 3 pages (Sep. 18, 2003).
Japanese Office Action for JP2014-538797 and English Translation, 8 pages (Mar. 29, 2016).
Krstic, A. et al., Testing High Speed VLSI Device Using Slower Testers, VLSI Test Symposium, 17th IEEE Proceedings, 6 pages (Apr. 25-29, 1999).
Teledyne LeCroy, Protocol Analyzer, Products and Overview, 7 pages (2017). URL: http://teledynelecroy.com/protocolanalyzer [Retrieved Mar. 20, 2017].
USB, Frequently Asked Questions, 3 pages. URL: http://www.usb.org/about/faq/ [Retrieved Mar. 20, 2017].

\* cited by examiner

… (1)

PROGRAMMABLE TEST INSTRUMENT

TECHNICAL FIELD

This disclosure relates generally to a programmable test instrument

BACKGROUND

Automatic test equipment (ATE) plays a role in the manufacture of electronics, such as semiconductor devices and circuit board assemblies. Manufacturers generally use automatic test equipment, or "tester instruments", to verify the operation of devices during the manufacturing process. Such devices are referred to as a "device under test" (DUT) or a "unit under test" (UUT). Early detection of faults eliminates costs that would otherwise be incurred by processing defective devices, and thus reduces the overall costs of manufacturing. Manufacturers also use ATE to grade various specifications. Devices can be tested and binned according to different levels of performance in areas, such as speed. Devices can be labeled and sold according to their actual levels of performance.

SUMMARY

In general, in one aspect, a test instrument includes a first processing system that is programmable to run one or more test programs to test a device interfaced to the test instrument, and that is programmed to control operation of the test instrument, a second processing system that is dedicated to device testing, the second processing system being programmable to run one or more test programs to test the device, and programmable logic configured to act as an interface between the test instrument and the device, the programmable logic being configurable to perform one or more tests on the device. The first processing system and the second processing system are programmable to access the device via the programmable logic.

In general, in another aspect, a test instrument includes a first tier system for interacting with an environment external to the test instrument, the first tier system being programmable to perform testing operations on a device, a second tier system that is programmable to perform testing operations on the device, and a third tier system for interfacing to the device, the third tier system being configurable to perform testing operations on the device. The first tier system and the second tier system are programmed to access the device through the third tier system.

Aspects may include one or more of the following features. The first processing system has a first testing latency, the second processing system has a second testing latency, and the programmable logic has a third testing latency, the first testing latency being greater than the second testing latency, and the second testing latency being greater than the third testing latency. The first testing latency is on the order of milliseconds, the second testing latency is on the order of microseconds, and the third testing latency is on the order of nanoseconds. The first processing system is programmed to run one or more test programs to test the device interfaced to the test instrument, the second processing system is not programmed to run one or more test programs to test the device, and the programmable logic configured is not configured to perform one or more tests on the device. The first processing system is not programmed to run one or more test programs to test the device interfaced to the test instrument, the second processing system is programmed to run one or more test programs to test the device, and the programmable logic is not configured to perform one or more tests on the device. The first processing system is not programmed to run one or more test programs to test the device interfaced to the test instrument, the second processing system is not programmed to run one or more test programs to test the device, and the programmable logic is configured to perform one or more tests on the device. The first processing system includes a processing device that executes a windowing operating system, the second processing system includes one or more processing devices, each of the one or more processing devices corresponding to a different device to be tested by the test instrument, and the programmable logic includes one or more field programmable gate arrays (FPGAs), each of the one or more FPGAs corresponding to a different device to be tested by the test instrument.

The programmable logic includes field programmable gate arrays (FPGAs), at least one of the FPGAs being programmable logic being configurable to perform one or more tests on the device, and at least one of the FPGAs being pre-programmed to perform functions that do not involve exchange of data with the device to be tested. At least one of the first processing system, the second processing system, and the programmable logic is reprogrammable via one or more interfaces. Controlling operation of the test instrument includes one or more of the following: exchanging communications between the test instrument and one or more entities over a network, scanning the test instrument for malware, and performing memory management functions.

Two or more of the features described in this disclosure, including this summary section, may be combined to form embodiments not specifically described herein.

The systems and techniques described herein, or portions thereof, may be implemented as a computer program product that includes instructions that are stored on one or more non-transitory machine-readable storage media, and that are executable on one or more processing devices. The systems and techniques described herein, or portions thereof, may be implemented as an apparatus, method, or electronic system that may include one or more processing devices and memory to store executable instructions to implement the stated functions.

The details of one or more implementations are set forth in the accompanying drawings and the description below. Other features, objects, and advantages will be apparent from the description and drawings, and from the claims.

DETAILED DESCRIPTION

Described herein is a test instrument having a multi-tiered architecture. For example, the architecture may include a first tier processing system that interacts with an environment external to the test instrument, and that is programmable to perform testing operations on a unit under test (UUT). The architecture may also include a second tier processing system that is programmable to perform testing operations on the UUT, and a third tier processing system that interfaces to the UUT and that is also configurable to perform testing operations on the DUT. The architecture may also be configured so that the first tier processing system and the second tier processing system access the device through the third tier system.

Figure 1:
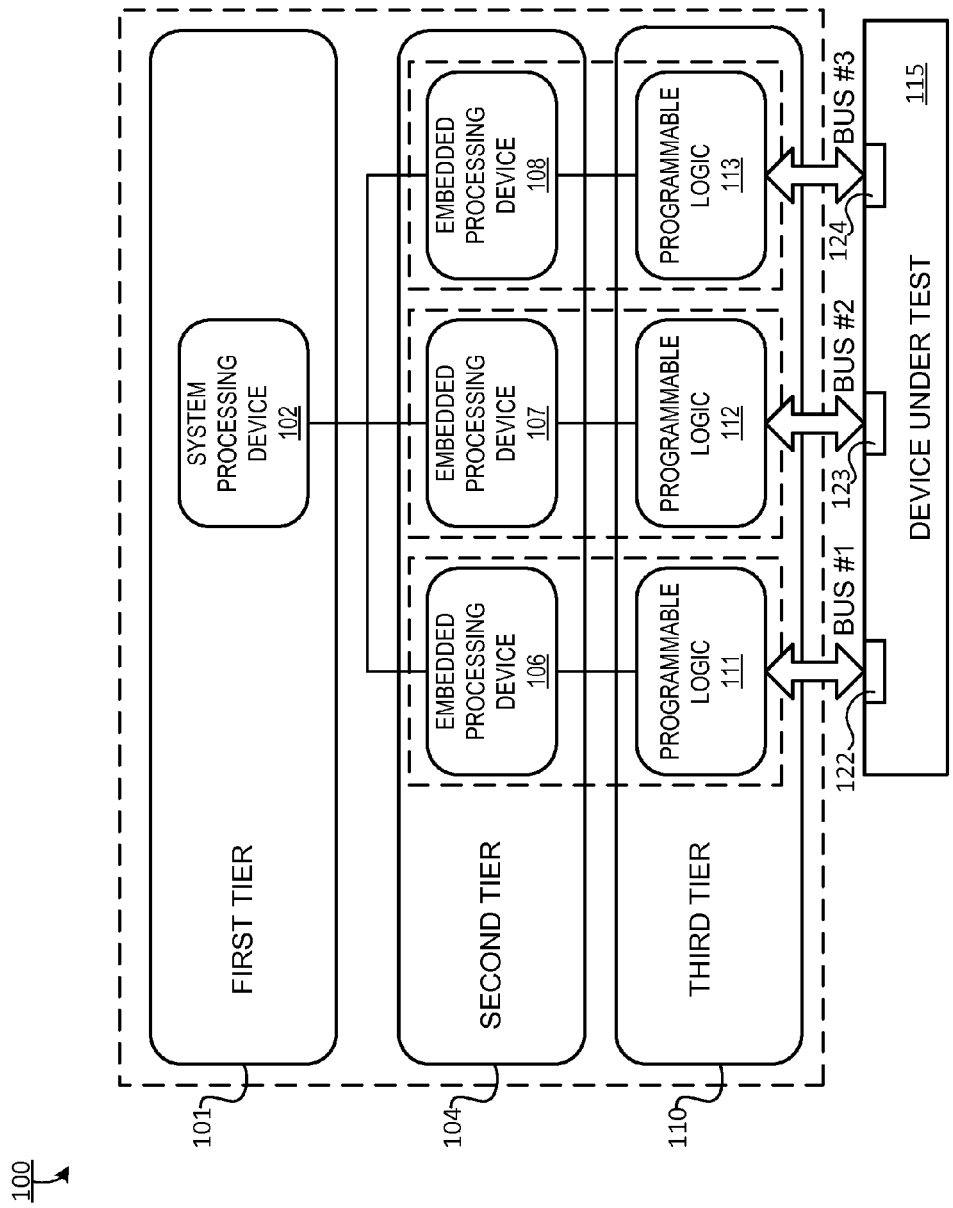
FIG. 1 is a block diagram of an example test instrument.

FIG. 1 is a block diagram of an example implementation of the foregoing test instrument 100. In FIG. 1, test instrument 100 includes a three-tiered processing system. However, in other example implementations, there may be more, or less, tiers. The different tiers of test instrument 100 reflect the relative relationship of the tiers to the DUT. In this example, first tier 101 includes a computer 102. Computer 102 controls various features of test instrument 100, such as communication with an external network. In addition, computer 102 is programmable to perform various testing operations, as described below. Second tier 104 includes one or more processing devices 106 to 108 that are dedicated to testing. For example, processing devices 106 to 108 typically do not perform non-test functions like test instrument control and network communication; however, the processing devices 106 to 108 may perform tasks such as communication and flow of control, interrupts, and timing. Third tier 110 includes logic 111 to 113 that is programmable both to act as an interface to a DUT 115 and to perform one or more test operations on the DUT.

In this example first tier 101, computer 102 includes one or more processing devices, such as one or more microprocessors or a single multi-core microprocessor (not shown). Computer 102 also includes memory (not shown) that stores executable code to control test instrument communication with the external environment, and to perform various "housekeeping" functions to control operation of test instrument 100. For example, computer 102 may be responsible for exchanging communications between the test instrument and one or more external entities over a network interface 120, scanning the test instrument for malware, memory management, power control, and other functions that are not specifically related to testing the DUT.

Computer 102 is also programmable to perform test operations on a DUT (e.g., 115) interfaced to test instrument 100. The test operations may include, but are not limited to, testing bus speed, reaction time, or any other appropriate operational aspects of the DUT. In general, the testing that is performed is dependent upon the type of device being tested, and the information sought during testing.

One or more test programs may be loaded into memory on computer 102, and executed by processing device(s) in computer 102 in order to perform the testing. While performing testing, computer 102 may continue to perform other functions, such as those described above, to keep test instrument 100 operational. Consequently, the test latency (e.g., the amount of time between the start of a test and receipt of test results) can be on the order of milliseconds. This is but an example of the test latency. In different systems, numerous factors may have an effect on test latency, such as the speed of the processing device(s) in computer 102, the amount of memory available in computer 102 to run the test programs, and so forth.

A possible advantage of performing testing via computer 102 relates to development costs of test programs. More specifically, computer 102 may run a an OS like Windows, or other relatively user-friendly, operating system. Tools available for development of test programs on such an operating system are typically widely available, and generally well known to test program developers. As a result, the cost of developing test programs on computer 102, to run on computer 102, can be less than the cost of developing test programs to run on the other tiers of the multi-tiered architecture. This generalization, however, may not apply in all cases.

In this example, second tier 104 includes multiple embedded processing devices 106 to 108. Here, three embedded processing devices are shown; however, test instrument 100 may include any appropriate number of embedded processing devices, e.g., one, two, four, five or more. These processing devices are embedded in the sense that they are incorporated into test instrument 100; and are dedicated to performing test functions (e.g., to testing DUTs interfaced to test instrument 100). Embedded processing devices 106 to 108 typically are not responsible for test instrument operations like the "housekeeping" operations described above that are performed by computer 102. However, in some implementations, embedded processing devices 106 to 108 may be programmed to perform one or more such operations, or other operations not specifically directed to testing DUTs.

Each embedded processing device 106 to 108 may include, e.g., a microcontroller or a microprocessor having a single core or multiple cores. Each microprocessor is programmable, either directly or via computer 102. For example, a user of test instrument 100 may interact with the operating system of computer 102 to program an embedded processing device 106. Alternatively, there may a direct interface, e.g., hardware or software, through which each embedded processing device may be programmed. Programming, in this context, refers to storing one or more test programs onto a respective embedded processing device, which can be executed on that embedded processing device to test a DUT.

As shown in FIG. 1, each embedded processing device is interfaced to computer 102 and to respective programmable logic (in this example, a field programmable gate array (FPGA)). As explained below, each FPGA acts as an interface to a separate DUT (not shown) or to a portion of a single DUT (e.g., a bus 122, 123, 124 on that DUT, as shown) for testing. Accordingly, in this example, each embedded processing device may be programmed with a test program designed specifically for the corresponding DUT, or portion thereof being tested. As noted, an appropriate test program may be loaded directly into the embedded processing device or it may be loaded via computer 102. Each embedded processing device may execute its own test program separately, and concurrently with, other embedded processing devices. In some implementations, there may be coordination among the embedded processing devices as to how their respective test programs are to be executed. Such coordination maybe implemented by the embedded processing device themselves or by computer 102. In some implementations, the coordination may involve devices at different tiers of the architecture. In some implementations, the different embedded processing devices 106 to 108 may implement different portions (e.g., modules) of the same test program, with or without appropriate coordination.

A possible advantage of performing testing via an embedded processing device relates to test latency. More specifically, because the embedded processing devices are dedicated to testing, their resources are not typically taxed by other tasks. As a result, testing latency can be less than that achieved by computer 102. For example, test latency for an embedded processing device can be on the order of microseconds. This, however, is but an example of embedded processing device test latency. In different systems, numerous factors may have an effect on test latency, such as processing device speed, the amount of memory available to run the test programs, and so forth. Accordingly, the foregoing generalization may not apply in all cases.

Furthermore, tools are available for development of test programs on the embedded processing devices. As a result, the cost of developing test programs on an embedded processing device, to run on an embedded processing device, can be less than the cost of developing test programs to run on hardware, such as an FPGA.

Third tier 110 includes programmable logic, e.g., FPGAs 111 to 113, although other types of programmable logic may be used in lieu of FPGAs. Each FPGA is configured by loading a program image into the FPGA. This program image is referred to as an "FPGA load". In this example, each FPGA is configured to act as an interface between a DUT, or portion thereof (e.g., a DUT bus) and test instrument 100. For example, an FPGA may specify a port width, port speed (e.g., 10 MHz to 400 MHz), the number of input ports, the number of output ports, and so forth.

First tier 101 computing device(s) (e.g., computer 102) and second tier 104 computing device(s) (e.g., embedded processing devices 106 to 108) access DUT 115 through third tier 110. For example, as shown in FIG. 1, each embedded processing device may communicate with DUT 115 through a corresponding FPGA. Computer 102 may communicate with DUT 115 through one or more FPGAs, depending upon which DUT, or portion of a DUT, is being currently tested. In some implementations, each interface implemented by an FPGA is programmable. In other implementations, the interface implemented by each FPGA is static (e.g., not programmable).

Each FPGA may also be configurable to perform one or more tests on a corresponding DUT, or portion thereof to which the FPGA is interfaced. For example, the FPGA load for each FPGA may include one or more test routines that are run by the FPGA to test various aspects of the DUT. As above, the routines that are implemented depend upon the device being tested, and the information sought during testing. Test routines run by each FPGA may be run independently of other test routines run by other FPGAs, or there may be coordination among the various FPGAs. Each FPGA may execute its own test routine separately, and concurrently with, other embedded processing devices. In some implementations, there may be coordination among the FPGAs as to how their respective test programs are to be executed. Such coordination maybe implemented by the FPGAs themselves, by their corresponding embedded processing devices, or by computer 102. In some implementations, the coordination may involve devices at different tiers of the architecture. For example, computer 102, in concert with embedded processing devices 106 to 108, may coordinate operation of respective FPGAs 111 to 113. In some implementations, the different FPGAs may implement different portions (e.g., modules) of the same test routine, with or without appropriate coordination.

A possible advantage of performing testing via an FPGA relates to test latency. More specifically, because the FPGAs are hardware devices, they are able to run at higher speeds than the test routines programmed into either the embedded processing devices 106 to 108 or computer 102. As a result, testing latency can be less than that achieved by embedded processing devices 106 to 108 or computer 102. For example, test latency for an Programmable device can be on the order of nanoseconds. This, however, is but an example of FPGA test latency. In different systems, numerous factors may have an effect on test latency. Accordingly, the foregoing generalization may not apply in all cases.

In some implementations, testing may be performed exclusively by one tier or another of the architecture. For example, computer 102 may be programmed to run one or more test programs to test a DUT, while devices on other tiers of the architecture do not perform DUT tests. Embedded processing devices 106 to 108 may be programmed to run one or more test programs to test a DUT, while devices on other tiers of the architecture do not perform DUT tests. FPGAs 111 to 113 may be configured to run one or more tests on the device, while devices on other tiers of the architecture do not perform DUT tests. Devices that are not performing tests are not necessarily dormant during this time. For example, computer 102 may continue to perform the housekeeping operations described above; the FPGAs may continue to route data to/from the DUT (i.e., to act as interfaces to the DUT); and the embedded processing devices may continue be active in coordination or other communication (e.g., transmitting test results from the FPGAs to computer 102).

In other implementations, testing may be performed by different tiers of the architecture concurrently or in concert. For example, two or more of computer 102, embedded processing devices 106 to 108, and FPGAs 111 to 113 may act in coordination, at the same time or within the same test sequence, to perform one or more test operations on a single DUT or on multiple DUTs. To effect such coordination, appropriate programming is loaded into computer 102 and/or embedded processing devices 106 to 108, and/or an appropriate image is loaded into the FPGAs. By way of example, a first test may be performed on a DUT by computer 102; a second test may be performed on the DUT by embedded processing device 106; and a third test may be performed on the DUT by FPGA 111. The first, second and third tests may be separate tests, or part of the same test sequence. Data from the first, second and third tests may be combined, e.g., in computer 102, and processed to obtain the appropriate test results. These test results may be sent to an external computer (not shown) for analysis and reporting. Any of tier of the architecture or another (e.g., third party) party computer (not shown) may perform the coordination.

In implementations where one or more tiers of the architecture have not been programmed, the unprogrammed tiers may be bypassed (at least as far as their test functionality is concerned). The unprogrammed tiers may be pre-programmed or pre-configured to perform various functions, such as those described above relating to programming and communication among the tiers and with an external network.

Devices at the various tiers may be programmed or configured in real-time. In this context, "real-time" includes programming at test time or shortly before test time. That is, the test instrument need not come pre-programmed with test programs that are to be run on a DUT. Those test programs may be incorporated into the instrument at the appropriate time. Existing test programs on the test instrument may likewise be replaced with new test programs, as appropriate.

Figure 2:
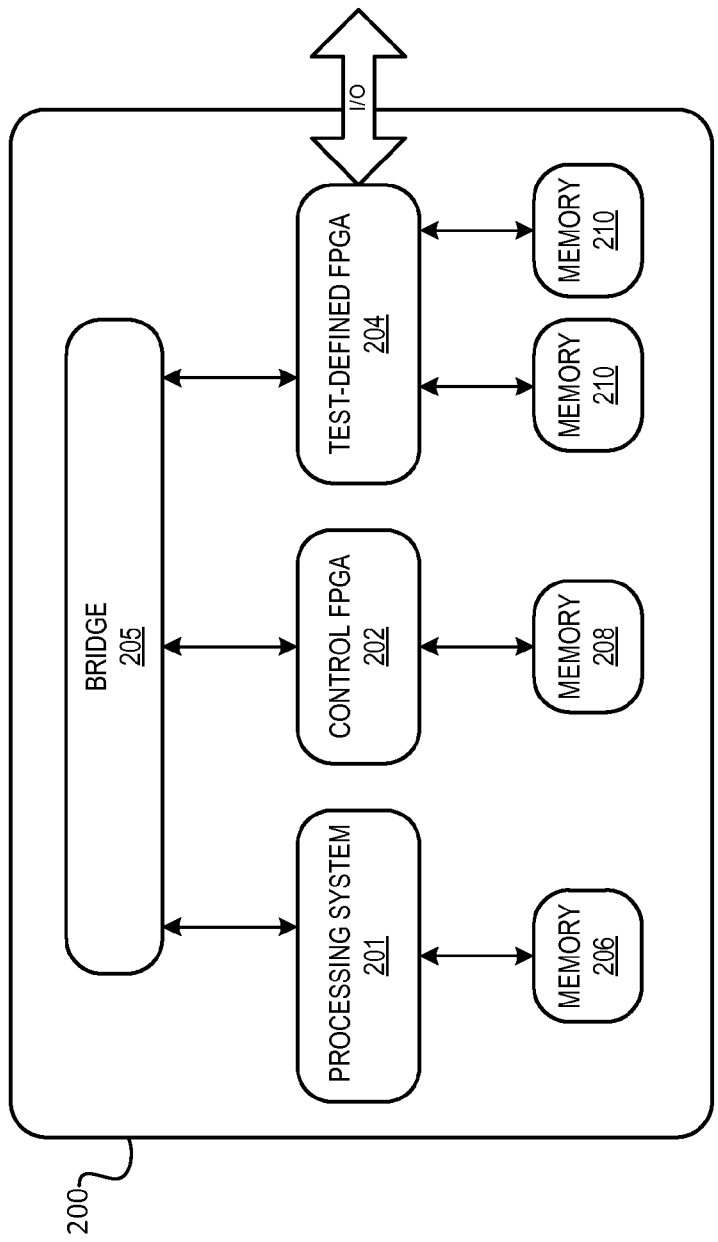
FIG. 2 is a block diagram of showing examples of features that may be incorporated into the example test instrument of FIG. 1

FIG. 2 shows another example implementation of a test instrument 200 having a multi-tiered architecture. In the example of FIG. 2, test instrument 200 includes a processing system 201, a control FPGA 202, and a test-defined FPGA 204.

Processing system 201 may be a computer, such as computer 102; an embedded processing device, such as embedded processing system 106 to 108; or a two-tiered processing system, such as tiers 101 and 1-4.

Control FPGA 202 may be a dedicated FPGA that is configured to perform various housekeeping functions that are not within the purview, e.g., of a computer, such as computer 102. For example, those functions may include reading memory, determining die temperatures, and regulating power in the test instrument. In this implementation, control FPGA 202 is not configurable; however, it may be configurable in other implementations.

Test-defined FPGA 204 may be a configurable FPGA, such as FPGAs 111 to 113 of FIG. 1. More specifically, test-defined FPGA 204 may be configurable to perform one or more tests on a corresponding DUT, or portion thereof to which the test-defined FPGA is interfaced. For example, the FPGA load for each test-defined FPGA may include one or more test routines that are run by the test-defined FPGA to test various aspects of the DUT. As above, the routines that are implemented depend upon the device being tested, and the information sought during testing. Test routines run by each test-defined FPGA may be run independently of other test routines run by other test-defined FPGAs, or there may be coordination among test-defined FPGA 204 and other test-defined FPGAs (not shown) that are part of the test instrument. The types of coordination among test-defined FPGAs, embedded processing devices, and a computer are similar to those described above with respect to FIG. 1.

In the example of FIG. 2, control FGPA 202 and test-defined FPGA 204 are separate devices. In other implementations, their functionalities can be combined into a single, programmable FPGA.

FIG. 2 also shows a bridge 205. Bridge 205 may include one or more buses and other appropriate electronics for transmitting communications among the various devices included in test instrument 200.

As shown in FIG. 2, processing system 201 is associated with memory 206; control FPGA 202 is associated with memory 208; and test-defined FPGA 204 is associated with memory 210. Each such memory may be used for storing test data and/or test programs, as well as executing test programs. In this example implementation, each memory is dedicated to its corresponding device. However, control FPGA 202 may provide a path, through which test-defined FPGA 204 (or another system processing device) may access, and use, its corresponding memory.

Figure 3:
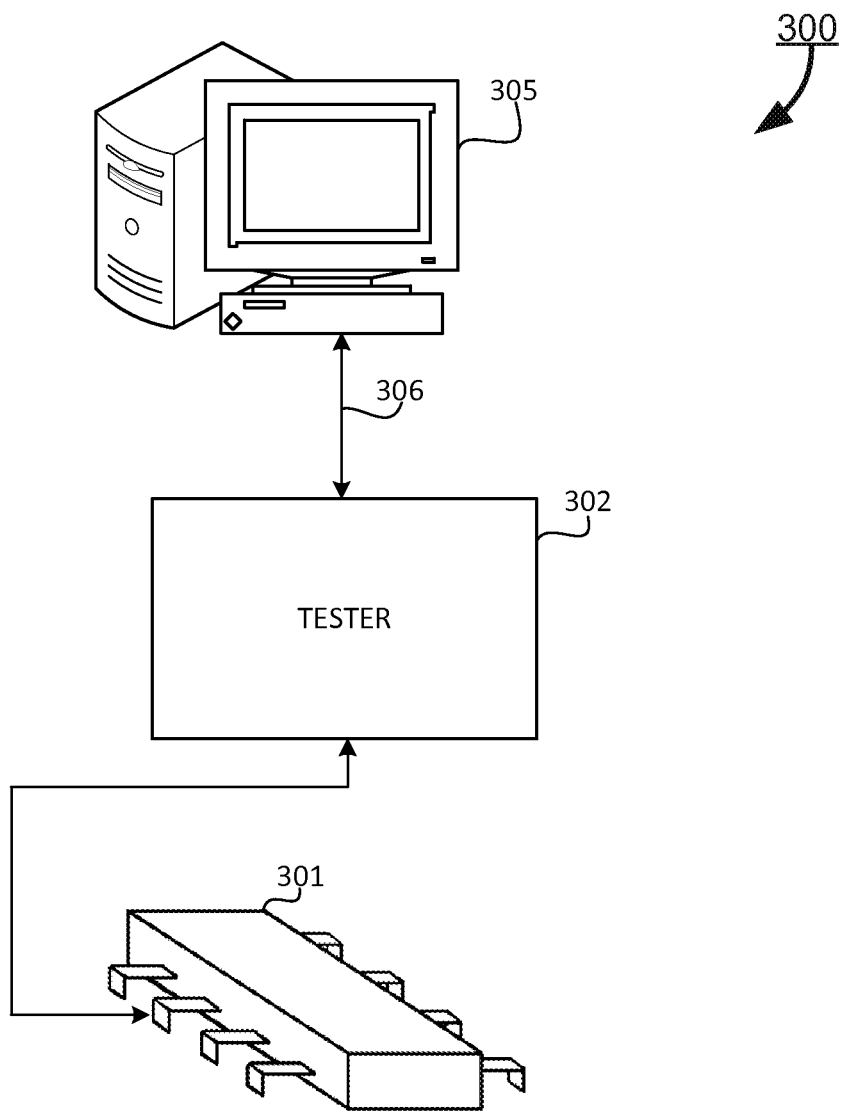
FIG. 3 is a block diagram of an example test system.

Referring now to FIG. 3, that figure shows an example of a system on which the architecture may be implemented. FIG. 3 shows an example test system 300 for testing a device-under-test (DUT) 301. Test system 300 includes a tester 302, which may have the multi-tiered architecture of FIG. 1 or 2. To interact with tester 302, system 300 includes a computer system 305 that interfaces with tester 302 over a network connection 306. As noted below, computer system 305 may incorporate the functionality of computer 102 (FIG. 1) or it may be an external computer that interacts with computer 102 on the test instrument. Typically, computer system 305 sends commands to tester 302 to initiate execution of routines and programs for testing DUT 301. Such executing test programs may initiate the generation and transmission of test signals to the DUT 301 and collect responses from the DUT. Various types of DUTs may be tested by system 300. For example, DUTs may be avionics, radar, weaponry, semiconductor devices, and so forth.

To provide test signals and collect responses from the DUT, tester 302 is connected, via an appropriate FPGA interface, to one or more connector pins that provide an interface for the internal circuitry of DUT 301. For illustrative purposes, in this example, device tester 302 is connected to a connector pin of DUT 301 via a hardwire connection to deliver test signals (to the internal circuitry of DUT 301). Device tester 302 also senses signals at DUT 301 in response to the test signals provided by device tester 302. For example, a voltage signal or a current signal may be sensed at a DUT pin in response to a test signal. Such single port tests may also be performed on other pins included in DUT 301. For example, tester 302 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent to DUT 301 for storage on DUT 301. Once stored, DUT 301 may be accessed to retrieve and send the stored digital value to tester 302. The retrieved digital value may then be identified to determine if the proper value was stored on DUT 301.

Along with performing one-port measurements, a two-port test may also be performed by device tester 302. For example, a test signal may be injected to a pin on DUT 301 and a response signal may be collected from one or more other pins of DUT 301. This response signal is provided to device tester 302 to determine quantities, such as gain response, phase response, and other throughput measurement quantities.

Figure 4:
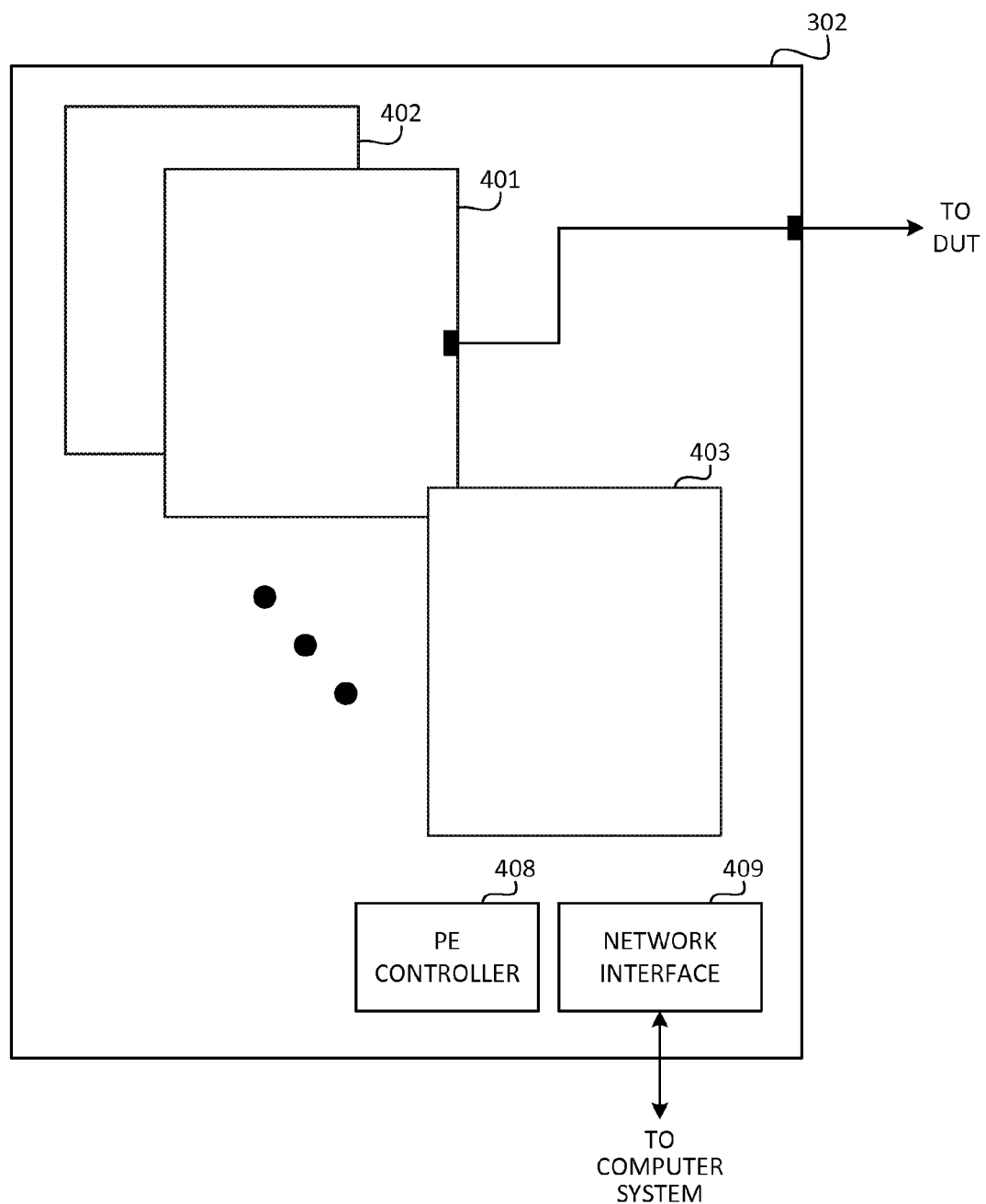
FIG. 4 is a block diagram of an example tester included in the test system.

Referring also to FIG. 4, to send and collect test signals from multiple connector pins of a DUT (or multiple DUTs), device tester 302 includes an interface card 401 that can communicate with numerous pins. For example, interface card 401 includes the one or more FPGAs described herein, which may be used to transmit test signals to the DUT and to collect corresponding responses. Each communication link to a pin on the DUT may constitute a channel and, by providing test signals to a large number of channels, testing time may be reduced since multiple tests may be performed simultaneously. Along with having many channels on an interface card, by including multiple interface cards in tester 302, the overall number of channels increases, thereby further reducing testing time. In this example, two additional interface cards 402 and 403 are shown to demonstrate that multiple interface cards may populate tester 302.

Each interface card may include dedicated integrated circuit circuitry, including, e.g., an FGPA and embedded processing device (as described, e.g., FIG. 1), for performing particular test functions. This circuitry may implement, e.g. a pin electronics (PE) stage for performing PE tests, and a parametric measurement unit (PMU) stage for performing tests. Typically PMU testing involves providing a (programmable) DC voltage or current signal to the DUT to determine such quantities as input and output impedance, current leakage, and other types of DC performance characterizations. PE testing involves sending DC or AC test signals, or waveforms, to a DUT (e.g., DUT 301) and collecting responses to further characterize the performance of the DUT. For example, the PE stage may transmit (to the DUT) AC test signals that represent a vector of binary values for storage on the DUT. Once these binary values have been stored, the DUT may be accessed by tester 302 to determine if the correct binary values have been stored.

In some arrangements, an interface device may be used to connect one or more conductors from tester 302 to the DUT. For example, the DUT may connect to an Interface Test Adapter (ITA) which interfaces with an Interface Connection Adapter (ICA) that connects with the tester. The DUT (e.g., DUT 301) may be mounted onto a device interface board (DIB) for providing access to each DUT pin. In such an arrangement, a DUT conductor may be connected to the DIB for placing test signals on the appropriate pin(s) of the DUT. Additionally, in some arrangements, tester 302 may connect to two or more DIBs for interfacing the channels provided by interface cards 401 to 403 to one or multiple DUTs.

To initiate and control the testing performed by interface cards 401 to 403, tester 302 includes a PE controller 408 (e.g., in a system processing device, in an embedded processing device, or in programmable logic) to provide test parameters (e.g., test signal voltage level, test signal current level, digital values, etc.) for producing test signals and analyzing DUT responses. Tester 302 also includes a network interface 409 that allows computer system 305 to control the operations executed by tester 302 and also allows data (e.g., test parameters, DUT responses, etc.) to pass between tester 302 and to computer system 305.

The computer system, or another processing device used on or associated with test system 300, may be configured to exchange communications with a test program running on tester 302 through active communication channels with the device tester. The computer system may be, or include, computer 102 of FIG. 1. Alternatively, computer 102 may be part of tester 302 and the computer system described with respect to FIG. 4 may communicate with computer 102.

The foregoing describes performing testing using a system processing device, embedded processing devices, or programmable logic. However, testing, as described herein, may be performed using a combination of system processing device, embedded processing devices, or programmable logic. For example, each of these different elements may run on or more test programs simultaneously to test the same device or portion thereof. Likewise, these different elements may coordinate testing so that, e.g., a system processing device (e.g., 102 of FIG. 1) performs a first part of a test sequence, an embedded processing device (e.g., 106 of FIG. 1) performs a second part of the same testing sequence, and programmable logic (e.g., FPGA 111 of FIG. 1) performs a third part of the same testing sequence. Any appropriate coordination may take place between the different programmable elements of the test instrument described herein.

Furthermore, in some implementations, a tier of processing may be circumvented. For example, testing may occur using a system processing device (e.g., 102) and programmable logic (e.g., FPGA 111), but not an embedded processing device. In such implementations, communications between the system processing device and the programmable logic may pass through an embedded processing device or bypass the embedded processing device tier altogether.

In some implementations, there may be more than three tiers of processing devices. For example, there may two tiers of embedded processing devices (resulting, e.g., in four tiers total). For example, a single embedded processing device may be used to coordinate testing of a single device, and different embedded processing devices (under the direction of that single embedded processing device) may be used to test different aspects or features of that single device.

In some implementations, one or more tiers of processing devices may be eliminated from the system of FIG. 1. For example, some implementations may not include a tier of embedded processing devices. In such example systems, there may be only a system processing device (e.g., 102 of FIG. 1) and programmable logic (e.g., FPGAs 111 to 113. In this regard, any appropriate combination of tiers may be employed in the test instrument described herein.

In some implementations, the system processing device (e.g., 102 of FIG. 1) may be external to the test instrument. For example, an external computer may be employed to control operations of the test instrument, and may interact with embedded processing device(s) and programmable logic on the test instrument in the manner described herein. In other implementations, the system processing device may be part of the test instrument or remote from the test instrument (e.g., connected to the test instrument over a network).

In some implementations, the programmable logic may be replaced with non-programmable logic. For example, rather than using an FPGA, one or more application-specific integrated circuits (ASICs) may be incorporated into the test instrument in place of, or in addition to, the programmable logic described herein.

The functionality described herein, or portions thereof, and its various modifications (hereinafter "the functions"), are not limited to the hardware described herein. All or part of the functions can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the circuitry shown in FIGS. 1 to 4 without adversely affecting its operation. Furthermore, various separate components may be combined into one or more individual components to perform the functions described herein.

Other embodiments not specifically described herein are also within the scope of the following claims.

What is claimed is:

1. A test instrument comprising:
    programmable logic programmed to act as an interface to a device under test, the programmable logic being configurable to perform one or more tests on the device, the programmable logic specifying a number of input ports and a number of output ports on the interface to the device;
    a first processing system that is programmable to run one or more test programs to test the device via the interface; and a second processing system that is dedicated to device testing, the second processing system comprising a plurality of embedded processing devices dedicated to device testing, the embedded processing devices being programmable to run one or more test programs to test the device via the interface;

wherein the second processing system is configured to transmit test results from the programmable logic to the first processing system;

wherein the programmable logic is configurable to execute one or more of the tests separately of the second processing system; and wherein the first processing system has a first testing latency, the second processing system has a second testing latency, and the programmable logic has a third testing latency, the first testing latency being greater than the second testing latency, and the second testing latency being greater than the third testing latency.

2. The test instrument of claim 1, wherein the first testing latency is on the order of milliseconds, the second testing latency is on the order of microseconds, and the third testing latency is on the order of nanoseconds.

3. The test instrument of claim 1, wherein the first processing system is programmed to run one or more test programs to test the device interfaced to the test instrument;
wherein the second processing system is not programmed to run one or more test programs to test the device; and
wherein the programmable logic is not configured to perform one or more tests on the device.

4. The test instrument of claim 1, wherein the first processing system is not programmed to run one or more test programs to test the device interfaced to the test instrument;
wherein the second processing system is programmed to run one or more test programs to test the device; and
wherein the programmable logic is not configured to perform one or more tests on the device.

5. The test instrument of claim 1, wherein the first processing system is not programmed to run one or more test programs to test the device interfaced to the test instrument;
wherein the second processing system is not programmed to run one or more test programs to test the device; and
wherein the programmable logic is configured to perform one or more tests on the device.

6. The test instrument of claim 1, wherein the first processing system comprises a processing device that executes a windowing operating system;
wherein each of the embedded processing devices is for testing a different device to be tested by the test instrument; and
wherein the programmable logic comprises one or more field programmable gate arrays (FPGAs), each of the one or more FPGAs being for testing a different device to be tested by the test instrument.

7. The test instrument of claim 1, wherein the programmable logic comprises field programmable gate arrays (FPGAs), at least one of the FPGAs being pre-programmed to perform functions that do not involve exchange of data with the device to be tested.

8. The test instrument of claim 1, wherein at least one of the first processing system, the second processing system, and the programmable logic is reprogrammable via one or more interfaces.

9. The test instrument of claim 1, wherein the first processing system is programmable to control operation of the test instrument by performing one or more of the following: exchanging communication between the test instrument and one or more entities over a network, scanning the test instrument for malware, and performing memory management functions.

10. The test instrument of claim 1, wherein at least two of the programmable logic, the first processing system, and the second processing system are configured to perform testing operations on the device concurrently.

11. A test instrument comprising:
a first tier system for interacting with an environment external to the test instrument, the first tier system being programmable to perform testing operations on a device;
a second tier system comprising a plurality of embedded processing devices dedicated to device testing, the embedded devices being programmable to perform testing operations on the device; and
a third tier system that is programmed to act as an interface to the device, the third tier system being configurable to perform testing operations on the device, the first tier system and the second tier system being programmed to access the device through the interface;
wherein the third tier system defines at least a number of input ports and a number of output ports of the interface to the device;
wherein the second tier system is configured to transmit test results from the third tier system to the first tier system; and
wherein the third tier system is configurable to execute one or more of the testing operations separately of the second tier system;
wherein the first tier system has a first testing latency, the second tier system has a second testing latency, and the third tier system has a third testing latency, the first testing latency being greater than the second testing latency, and the second testing latency being greater than the third testing latency.

12. The test instrument of claim 11, wherein the first testing latency is on the order of milliseconds, the second testing latency is on the order of microseconds, and the third testing latency is on the order of nanoseconds.

13. The test instrument of claim 11, wherein the first tier system is programmed to run one or more test programs to perform the testing operations on the device;
wherein the second tier system is not programmed to run one or more test programs to perform the testing operations on the device; and
wherein the third tier system is not configured to perform one or more of the testing operations on the device.

14. The test instrument of claim 11, wherein the first tier system is not programmed to run one or more test programs to perform the testing operations on the device;
wherein the second tier system is programmed to run one or more test programs to perform the testing operations on the device; and
wherein the third tier system is not configured to perform one or more testing operations on the device.

15. The test instrument of claim 11, wherein the first tier system is not programmed to run one or more test programs to perform the testing operations on the device;
wherein the second tier system is not programmed to run one or more test programs to perform the testing operations on the device; and
wherein the third tier system is configured to perform one or more testing operations on the device.

16. The test instrument of claim 11, wherein the first tier system comprises a processing device that executes a windowing operating system;

wherein each of the embedded processing devices is for testing a different device to be tested by the test instrument; and wherein the third tier system comprises one or more field programmable gate arrays (FPGAs), each of the one or more FGPAs being for testing a different device to be tested by the test instrument.

17. The test instrument of claim 11, wherein the third tier system comprises field programmable gate arrays (FPGAs), at least one of the FPGAs being configurable to perform one or more testing operations on the device, and at least one of the FPGAs being pre-programmed to perform functions that do not involve exchange of data with the device.

18. The test instrument of claim 11, wherein at least one of the first tier system, the second tier system, and the third tier system is reprogrammable via one or more interfaces.

19. The test instrument of claim 11, wherein the first tier system is programmable to control operation of the test instrument by performing one or more of the following: exchanging communications between the test instrument and one or more entities over a network, scanning the test instrument for malware, and performing memory management functions.

* * * * *